United States Patent
Ho et al.

(10) Patent No.: US 12,408,407 B2
(45) Date of Patent: Sep. 2, 2025

(54) METAL OXIDE SEMICONDUCTOR WITH MULTIPLE DRAIN VIAS

(71) Applicant: PANJIT INTERNATIONAL INC., Kaohsiung (TW)

(72) Inventors: Chung-Hsiung Ho, Kaohsiung (TW); Chih-Hung Chang, Kaohsiung (TW); Chi-Hsueh Li, Tainan (TW)

(73) Assignee: PANJIT INTERNATIONAL INC., Kaohsiung (TW)

( * ) Notice: Subject to any disclaimer, the term of this patent is extended or adjusted under 35 U.S.C. 154(b) by 421 days.

(21) Appl. No.: 17/966,905

(22) Filed: Oct. 17, 2022

(65) Prior Publication Data

US 2023/0402515 A1 Dec. 14, 2023

Related U.S. Application Data

(60) Provisional application No. 63/350,877, filed on Jun. 10, 2022.

(51) Int. Cl.
*H10D 64/23* (2025.01)
*H01L 23/00* (2006.01)
(Continued)

(52) U.S. Cl.
CPC ....... *H10D 64/254* (2025.01); *H01L 23/3171* (2013.01); *H01L 23/5226* (2013.01); *H01L 23/5283* (2013.01); *H01L 23/53233* (2013.01); *H01L 23/53238* (2013.01); *H01L 24/16* (2013.01); *H10D 64/258* (2025.01); *H01L 2224/16227* (2013.01);
(Continued)

(58) Field of Classification Search
CPC .. H10D 64/254; H10D 84/017; H10D 84/835; H10D 84/836; H10D 84/839; H10D 84/85; H01L 21/02293; H01L 21/20; H01L 23/522; H01L 23/5226; H01L 23/53233; H01L 24/06; H01L 2924/13091
See application file for complete search history.

(56) References Cited

U.S. PATENT DOCUMENTS

| | | | |
|---|---|---|---|
| 2013/0207172 A1* | 8/2013 | Hsieh | H10D 30/0295 438/270 |
| 2017/0084518 A1* | 3/2017 | Seddon | H01L 21/6835 |

FOREIGN PATENT DOCUMENTS

| | | | |
|---|---|---|---|
| TW | 201543671 A | | 11/2015 |
| TW | 202207311 A | | 2/2022 |

* cited by examiner

*Primary Examiner* — Wael M Fahmy
*Assistant Examiner* — Shamita S. Hanumasagar
(74) *Attorney, Agent, or Firm* — WPAT, PC

(57) ABSTRACT

A metal oxide semiconductor (MOS) with multiple drain vias includes a semiconductor substrate, which is divided into a gate region, a source region and a drain region. On the same surface of the semiconductor substrate in the gate region, a connection layer is formed in the source region and the drain region with a low-resistance metal material. A plurality of conductive elements, such as solder balls, can be directly arranged on the connection layer, so that the MOS can be soldered to the circuit board through the conductive elements distributed on the same surface. In the drain region, there are a plurality of vias. The inside of each via is filled with the connection layer and extends to the inside of the semiconductor substrate. With the aforementioned structure, the MOS has the advantage of low on-resistance $R_{DS(ON)}$.

6 Claims, 18 Drawing Sheets

(51) Int. Cl.
*H01L 23/31* (2006.01)
*H01L 23/522* (2006.01)
*H01L 23/528* (2006.01)
*H01L 23/532* (2006.01)

(52) U.S. Cl.
CPC ............... *H01L 2924/13091* (2013.01); *H01L 2924/30101* (2013.01); *H01L 2924/3011* (2013.01)

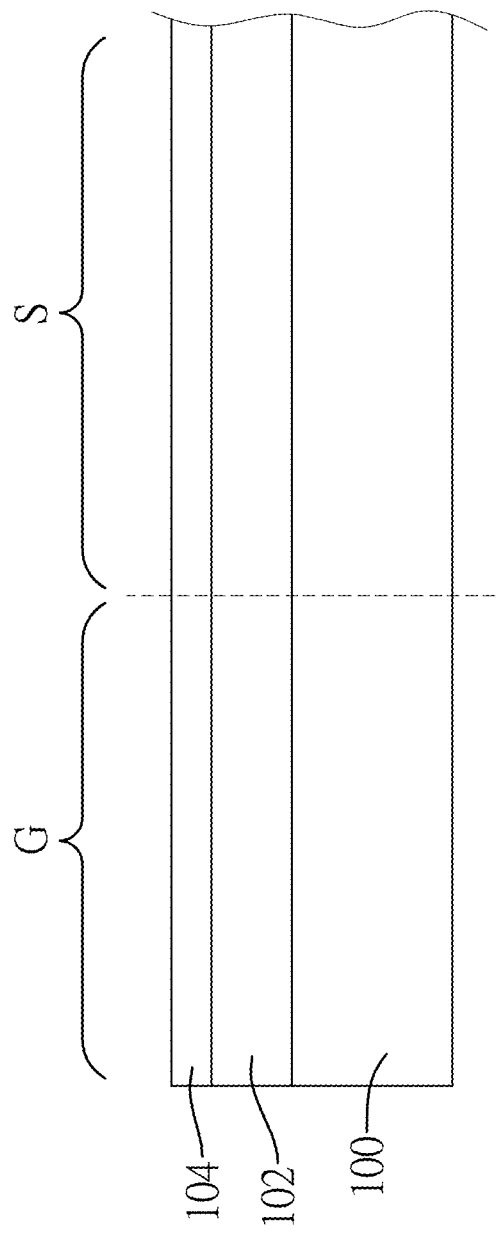
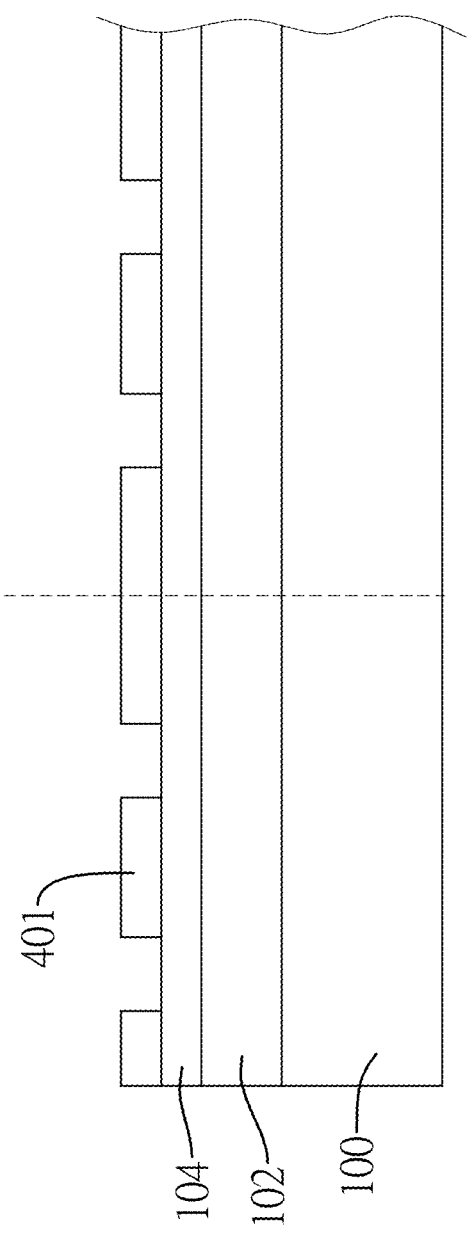

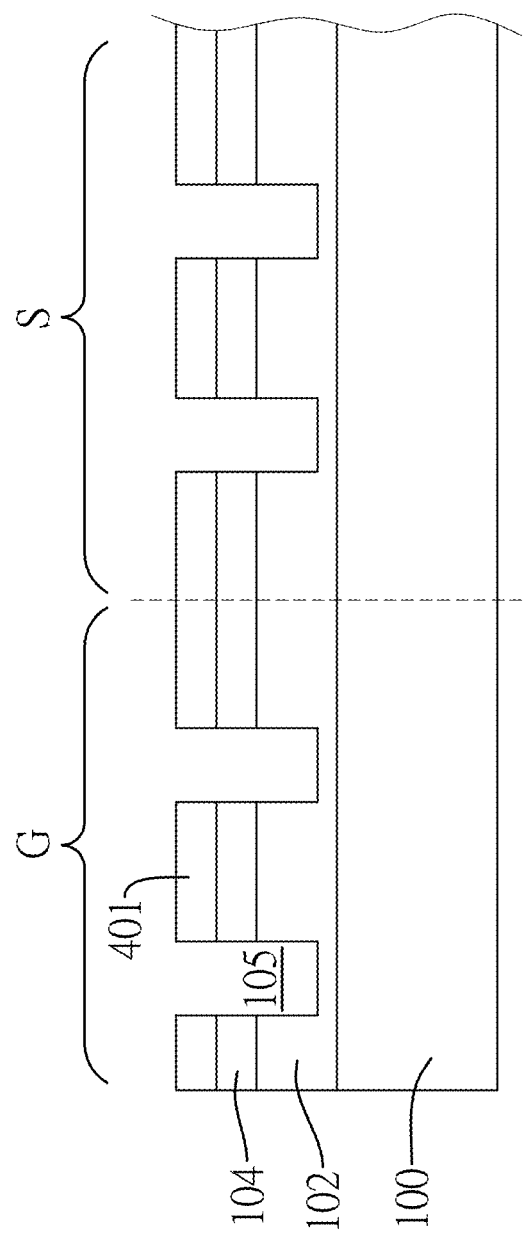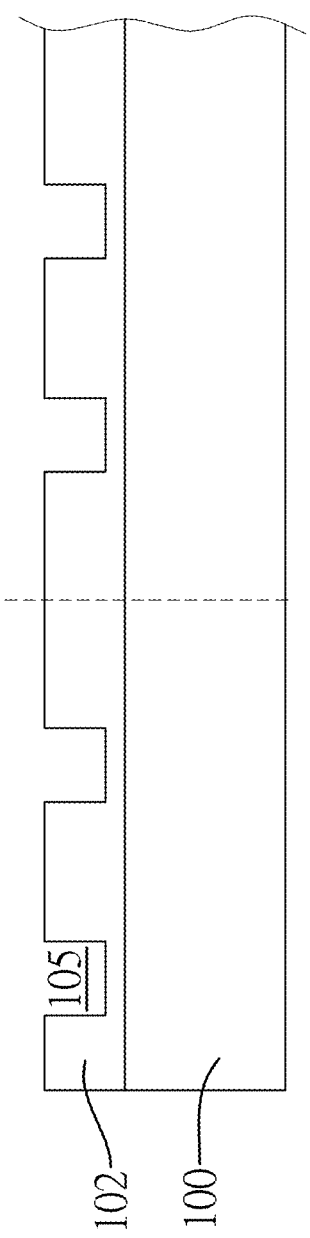

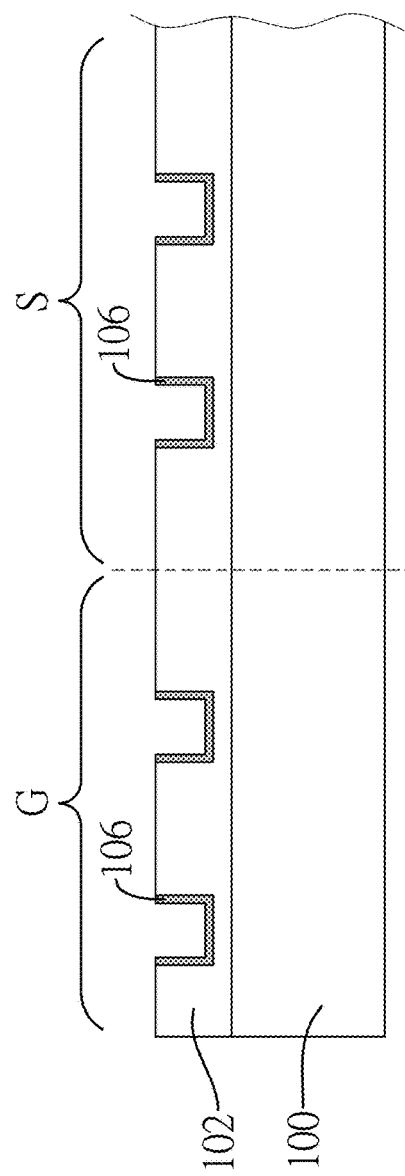
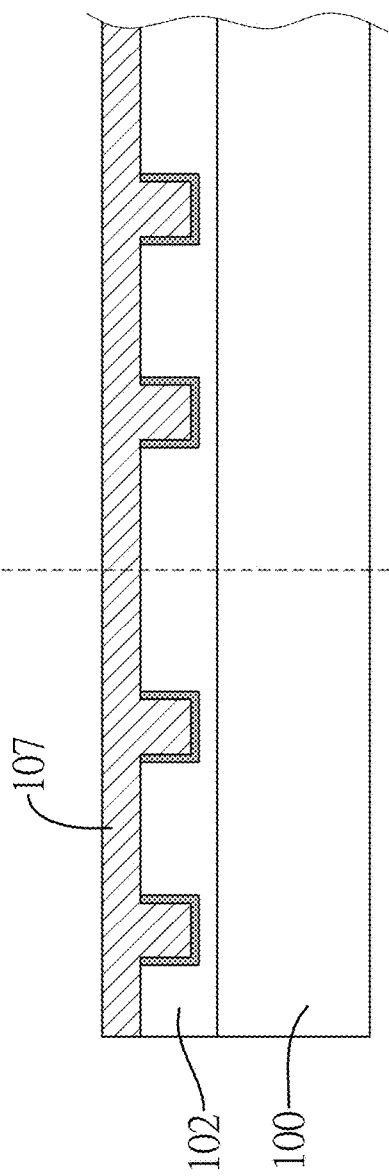
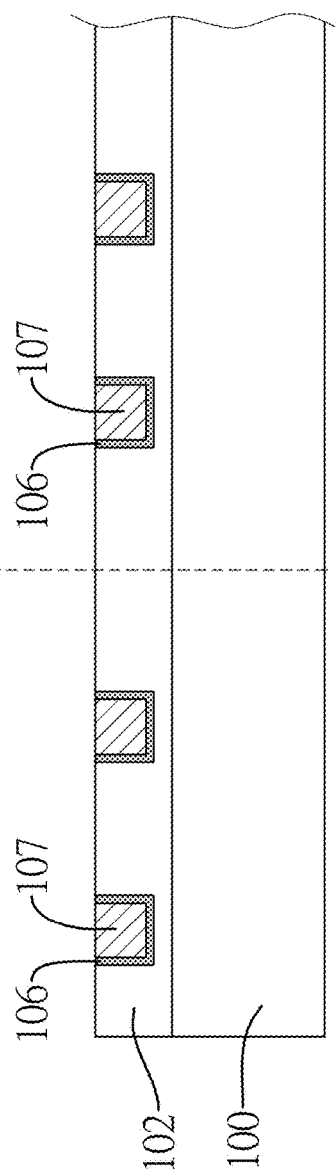

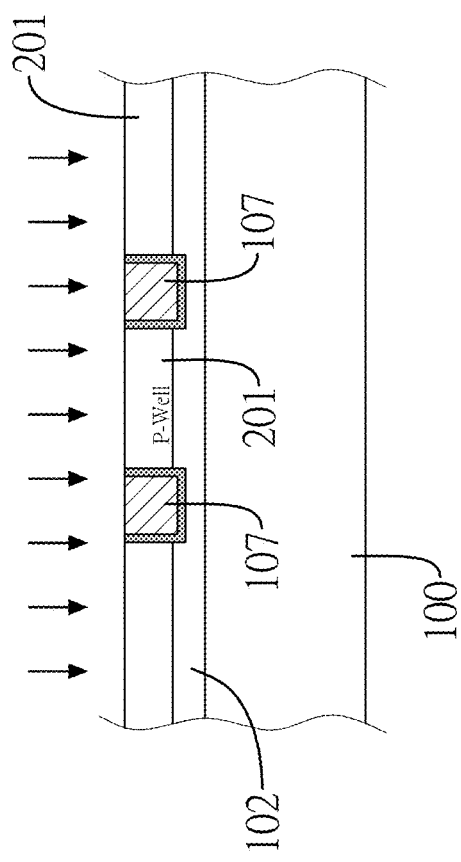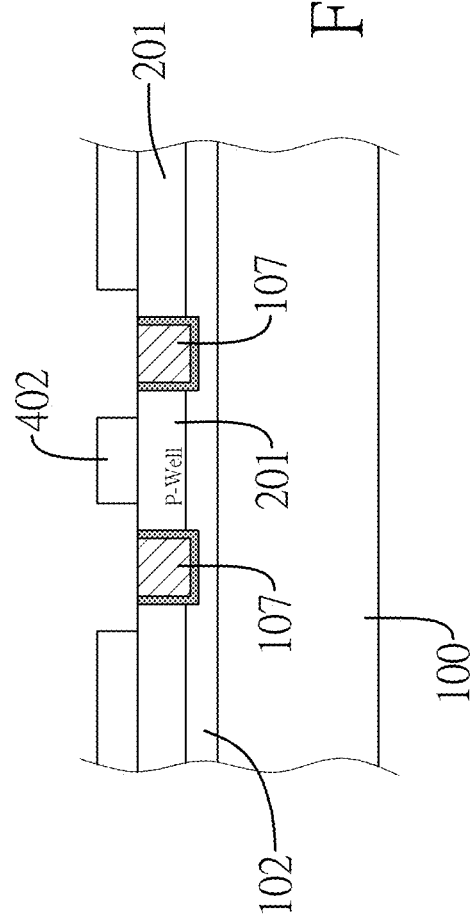

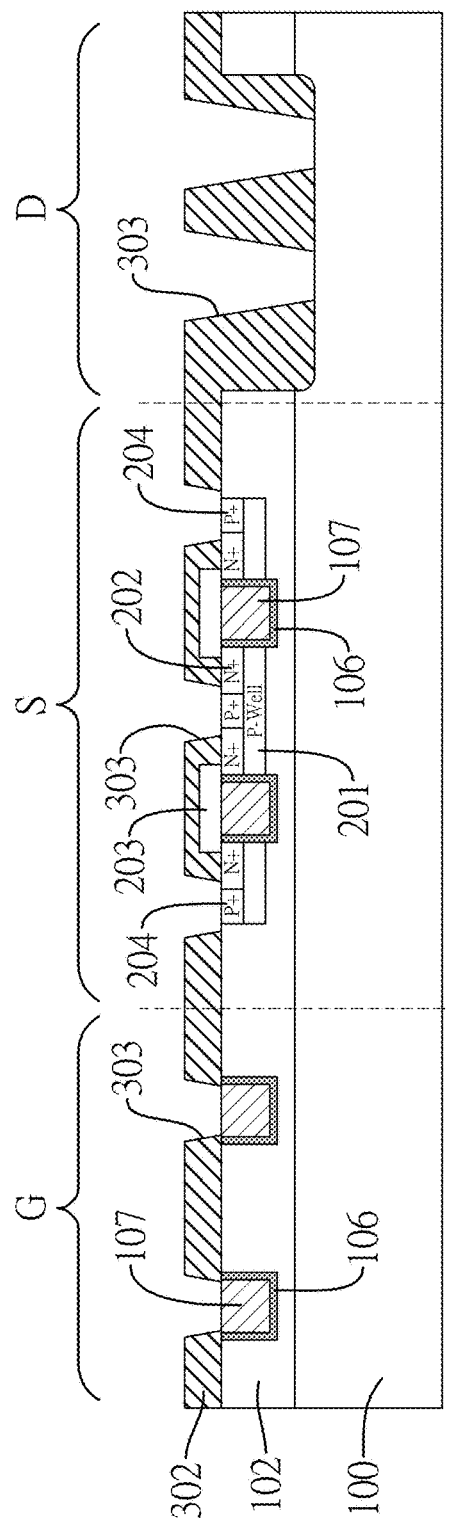

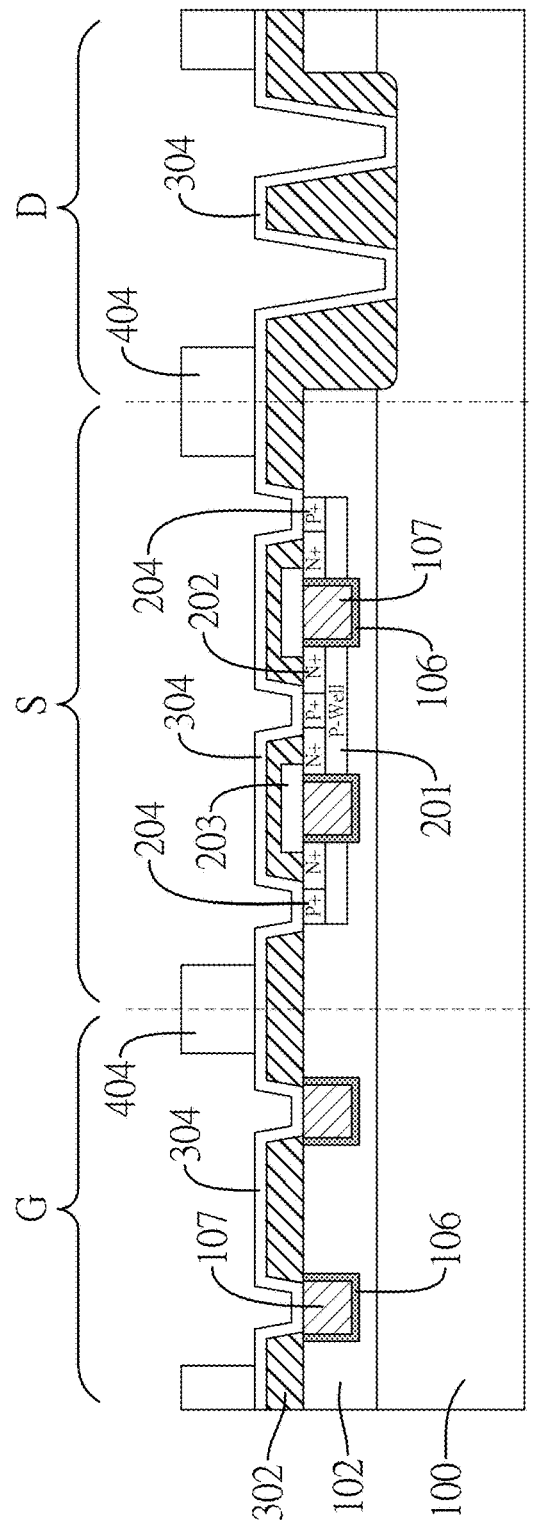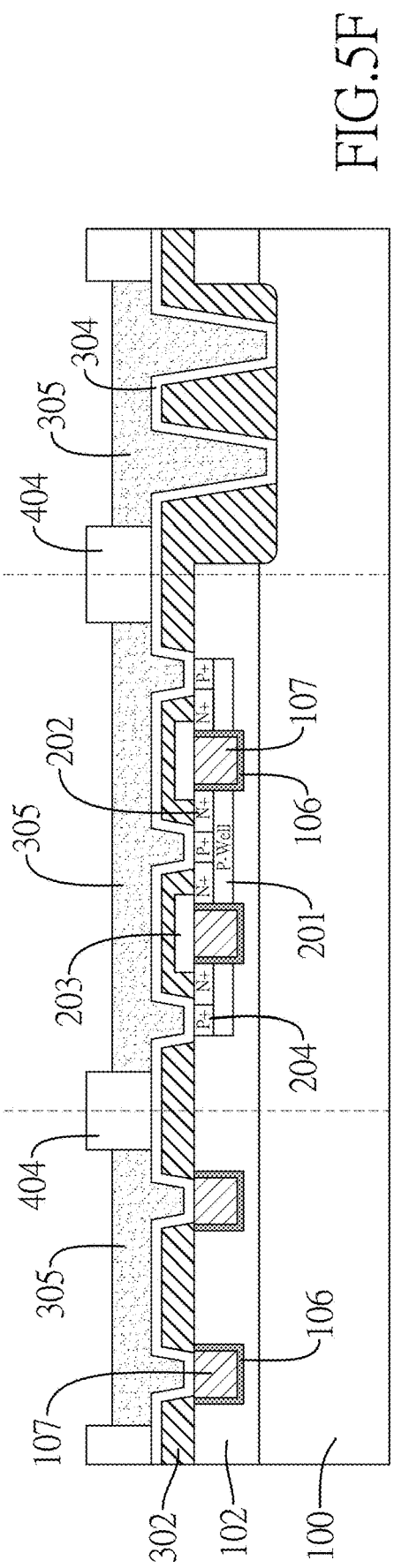

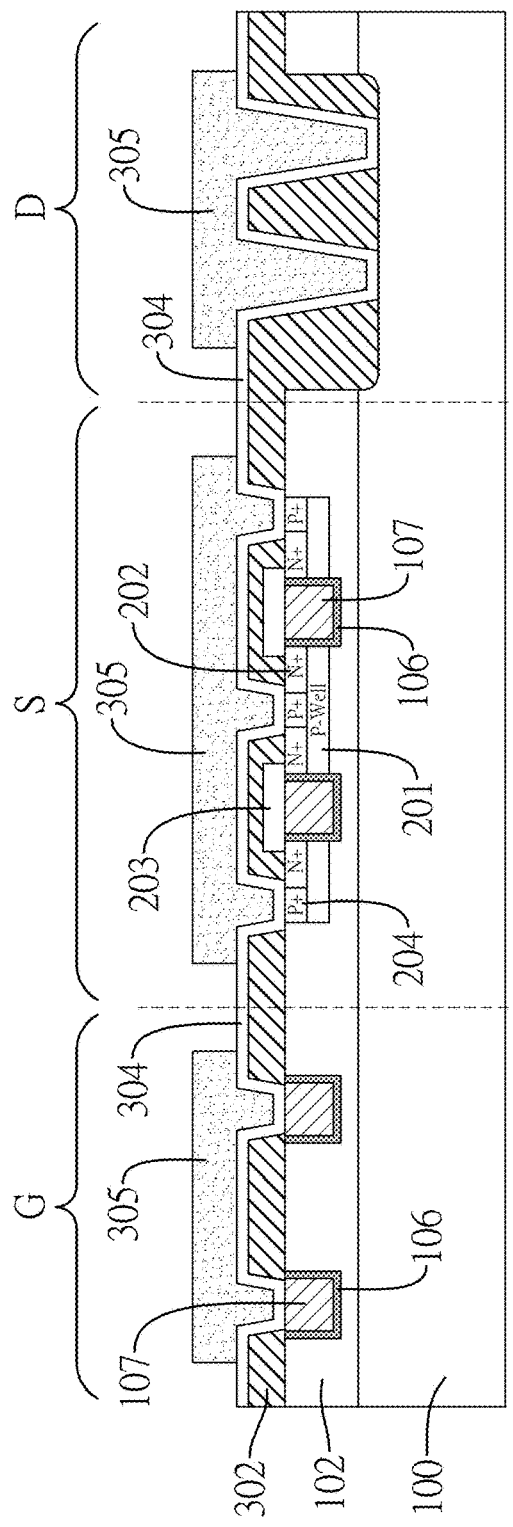

METAL OXIDE SEMICONDUCTOR WITH MULTIPLE DRAIN VIAS

CROSS REFERENCE TO RELATED APPLICATIONS

The present application claims benefit of U.S. provisional application No. 63/350,877, filed on Jun. 10, 2022, under 35 U.S.C. 119(e), the content of which is hereby incorporated by reference in its entirety.

BACKGROUND OF THE INVENTION

1. Field of the Invention

The present application relates to a metal oxide semiconductor (MOS) with multiple drain vias, and particularly to a metal oxide semiconductor element with a horizontal structure.

2. Description of Related Art

Most metal oxide semiconductor (MOS) chips are formed in a vertical design. The structure of the MOS chip is shown in FIG. 10. In terms of the contact layout of the chip, a contact of a gate region G and a contact of a source region S are both formed on a top side of the MOS chip, and a drain region D is formed by a metal layer on the backside of the chip. Because the drain region D is located vertically below the gate region G and the source region S, the structure of the MOS chip is called a vertical design.

FIG. 11 is a schematic side view of the mentioned MOS chip. The left region of the figure is the gate region G, and the right region is the source region S. The specific structures of the unit cells in the gate region G and the source region S are omitted from the figure. A metal layer 500 is formed on the surfaces of the gate region G and of the source region S, and the gate region G and the source region S are electrically connected through the metal layer 500.

With reference to FIG. 12, the MOS chip must be packaged such that it can be electrically connected to a circuit board. For example, the backside of the MOS chip (i.e., the drain region D) is attached on a lead frame 510, and the metal layers 500 on the surface of the gate region G and on the surface of the source region S are respectively and electrically connected to different pins of the lead frame 510 through a metal wire 520 by wire bonding. In FIG. 12, the metal layer 500 of the gate region G is also connected to another independent pin through an independent metal circuit, which is omitted from the figure. Finally, the chip is covered with an insulating material 530 to form a complete package of MOS.

MOS chips adopt a vertical design, so the chip must be repackaged before soldering on the circuit board. The drain region D at the bottom of the chip is made of metal and must be electrically connected to a substrate (such as the lead frame 510), and the metal layer 500 with the gate region G located on the top surface of the chip and the metal layer 500 with the source region S located on the top surface of the chip are electrically connected to the corresponding pins respectively through metal wires. Finally, the insulating material 530 is being processed on the chip. Therefore, many processing steps are required to package the MOS.

When the metal layer 500 is used as the conductive metal on the gate region G and the source region S, the on-resistance $R_{DS(ON)}$ of the MOS is difficult to further decrease, and this should be further improved.

SUMMARY OF THE INVENTION

The present invention provides a metal oxide semiconductor (MOS) with multiple drain vias, which can make the contacts of the gate, of the drain and of the source all located on the same surface, and has the characteristics of low on-resistance $R_{DS(ON)}$.

The MOS of the present invention comprises:
a semiconductor substrate, having a gate region, a source region and a drain region, wherein, the gate region, the source region, and the drain region each have a respective connection layer made of a metal material and formed on the same surface of the semiconductor substrate, and the connection layers on the gate region, on the source region and the on drain region are insulated and separated from each other;
wherein, a plurality of vias extending into the semiconductor substrate are formed in the drain region, and the connection layer is filled in the vias;
the connection layers on the gate region, on the source region and on the drain region are each electrically connected to a respective conductive element, and the MOS is electrically connected to the outside through the conductive elements.

The present invention can be fabricated by wafer-level chip scale packaging (WLCSP) technology, and the gate region, the source region and the drain region are made to be horizontally distributed. The MOS is provided with conductive elements on the same surface for external electrical connection. Therefore, there is no need to use a traditional lead frame or operations such as wire bonding and molding.

BRIEF DESCRIPTION OF THE DRAWINGS

FIGS. 3A-3G show processing step diagrams of the gate of the MOS of the present invention;

FIGS. 4A-4F show processing step diagrams of the source of the MOS of the present invention;

FIGS. 5A-5K show processing step diagrams of the drain of the MOS of the present invention;

DETAILED DESCRIPTION OF PREFERRED EMBODIMENT(S)

The present invention is a metal oxide semiconductor (MOS) with multiple drain vias, which can be a P-type metal oxide semiconductor (PMOS) or an N-type metal oxide semiconductor (NMOS). In the following description, a power metal oxide semi-field effect transistor (Power MOSFET) is used as an example for elaboration.

Figure 1:
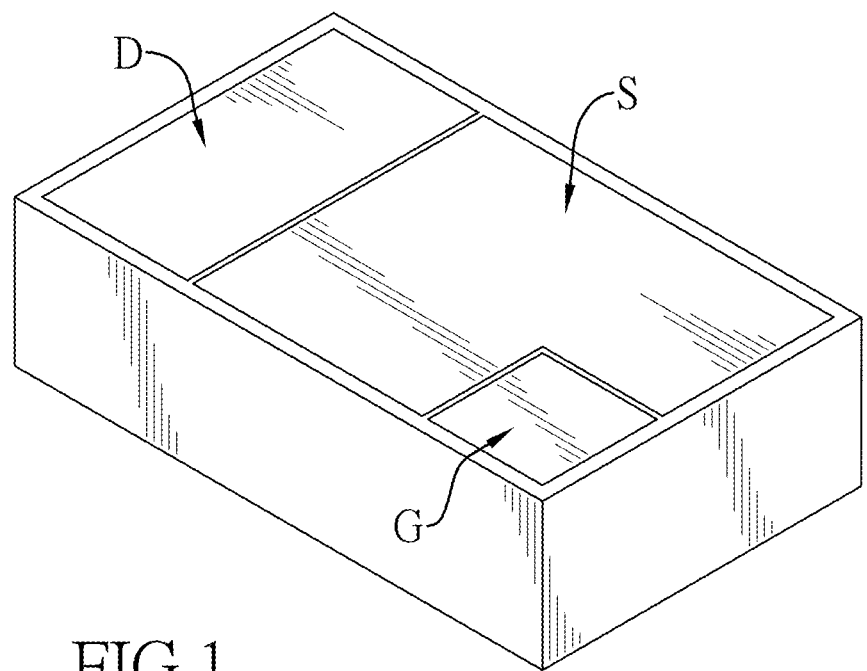
FIG. 1 is a three-dimensional schematic diagram of the gate contact, source contact and drain contact layout of the MOS of the present invention.
Figure 2:
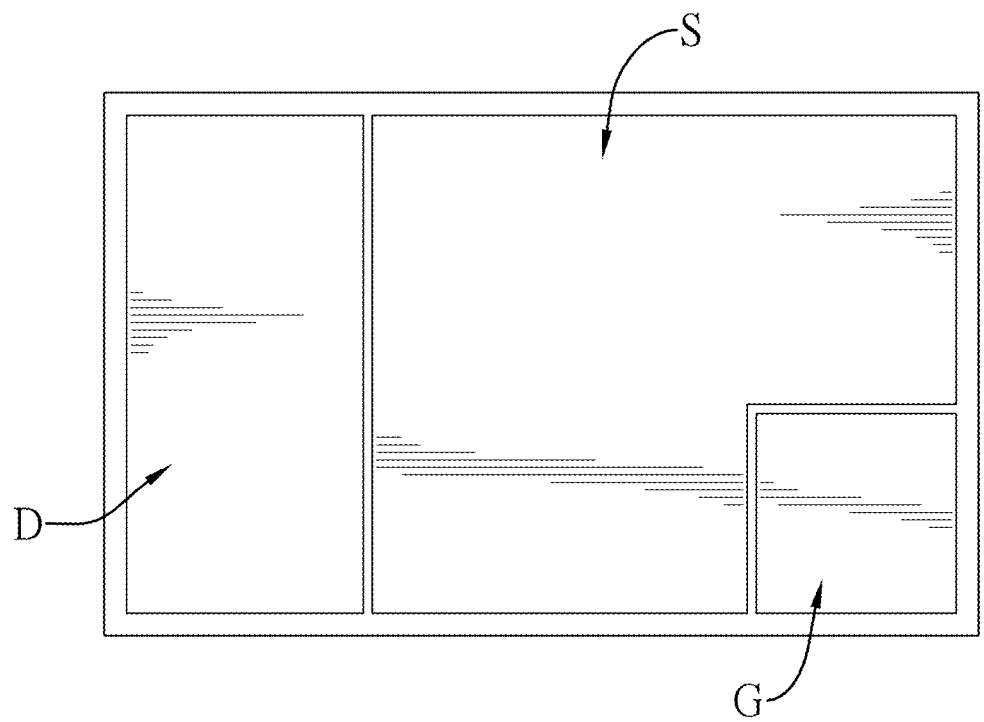
FIG. 2 is a surface schematic diagram of the gate contact, source contact and drain contact layout of the MOS of the present invention.

With reference to FIG. 1 and FIG. 2, the MOS of the present invention has a gate region G, a source region S and a drain region D, and these regions are used as contact regions for the MOS to be electrically connected to the outside elements. Different from the traditional vertical layout, the present invention makes the drain region D on the side of the source region S. In this embodiment, the drain region D is located on one side of the source region S, and the gate region G is located at the opposite corner of the source region S, so that the gate region G, the source region S, and the drain region D form a horizontal layout together. As for the area size of each region, the source region S is bigger than the drain region D, and the drain region D is bigger than the gate region G.

The following describes the cell unit structure in the gate region G, the source region S and the drain region D through the processing. The processes can be roughly divided into gate region fabrication, source region fabrication and drain region fabrication, and these processes are not limited to be performed sequentially. In one embodiment, several fabrication steps of the gate region G and the source region S are performed simultaneously. In the figures, each region is illustrated with 1 to 2 unit cells as an example, and the MOS actually includes a plurality of unit cells.

The production stage of the gate region:

With reference to FIG. 3A, a semiconductor substrate 100 is provided. The substrate 100 defines a gate region G, a source region S and a drain region D. The material of the substrate 100 can be selected from silicon, gallium arsenide, silicon germanium, silicon carbon or other semiconductor materials known in the semiconductor field. In this embodiment, an epitaxy layer 102 is grown on the substrate 100, and an oxide protection layer 104 is covered on the epitaxy layer 102. In one embodiment, the substrate 100 and the epitaxy layer 102 are the first conductivity type, e.g., N-type doped.

With reference to FIGS. 3B-3D, in the gate region G and the source region S, the substrate 100 is selectively etched to form grooves 105. As shown in FIG. 3B, a patterned first mask layer 401 is formed on the oxidation protection layer 104. The first mask layer 401 defines a gate pattern, and the area not covered by the first mask layer 401 is expected to form the gate. The first mask layer 401 may be a photoresist layer.

As shown in FIG. 3C, the area not covered by the first mask layer 401 is etched to form a groove 105, and the groove 105 extends into the epitaxy layer but does not penetrate the epitaxy layer 102. The etching method depends on the material of the first mask layer 401, such as wet etching, plasma etching, etc.

As shown in FIG. 3D, after the etching is completed, the first mask layer 401 and the oxide protection layer 104 on the substrate 100 are removed. In the gate region G and the source region S, a plurality of grooves 105 have been formed on the epitaxy layer 102.

As shown in FIG. 3E, a gate insulating layer 106 is formed inside the groove 105 of the epitaxy layer 102. The gate insulating layer 106 covers the bottom and sides of the groove 105 but does not completely fill the groove 105. Wherein, the gate insulating layer 106 may be a dielectric material formed by spin coating, heat treatment, or deposition.

As shown in FIG. 3F, a gate conductive layer 107 is deposited on the gate insulating layer 106. The thickness of the gate conductive layer 107 can fill each groove 105. Wherein, the material of the gate conductive layer 107 can be selected from polysilicon.

As shown in FIG. 3G, etching back the gate conductive layer 107 such that the gate conductive layer 107 only fills the interior of each groove 105 and is exposed to the epitaxy layer 102. The gate conductive layer 107 filled in each groove 105 serves as the gate conductive layer 107 of each unit cell.

Figure 4C:
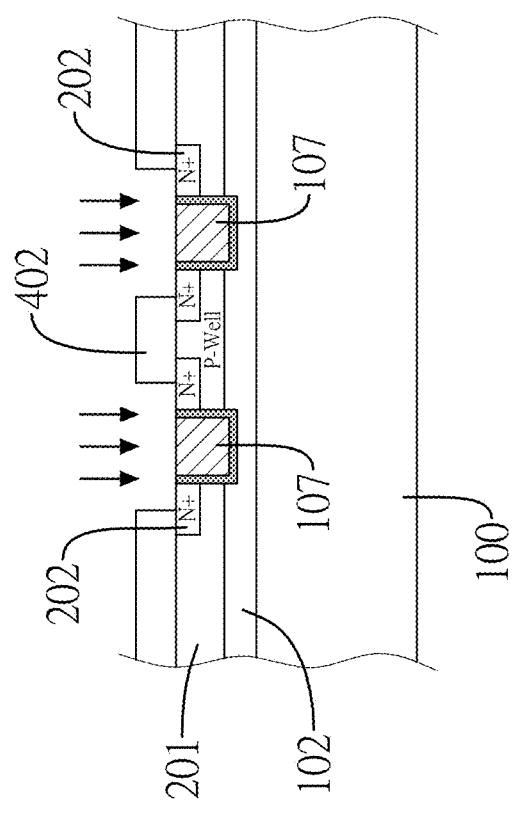

The production stage of the source region:

After the gate conductive layer 107 is filled in the groove 105, a source structure is formed in the source region S. In FIGS. 4A to 4F, only the fabrication process of the source region S is shown, and the structural representation of the gate region G and the drain region D is omitted. Referring to FIG. 4A, ion implantation or doping is performed on the epitaxy layer 102 to form a well 201. The material used for ion implantation or doping has a second conductivity type, such as P-type doping, which is different from the first conductivity type of the epitaxy layer 102. In one embodiment, the material for ion implantation or doping may be boron.

As shown in FIG. 4B, a patterned second mask layer 402 is formed on the epitaxy layer 102. The second mask layer 402 is used to define the source pattern, and the area not covered by the second mask layer 402 is expected to form the source. Wherein, the top and both sides of the groove 105 are not covered by the second mask layer 402. The second mask layer 402 may be a photoresist layer.

As shown in FIG. 4C, using the second mask layer 402 as a mask layer for implantation, ion implantation or doping is performed in the well 201 to form a first implanted region 202 of the source. The material used for ion implantation or doping has a first conductivity type, such as N-type doping, and the first implanted region 202 is adjacent to both sides of the groove 105. After the ion implantation is completed, an annealing operation is performed to stabilize the implanted material in the first implanted region 202.

Figure 4D:
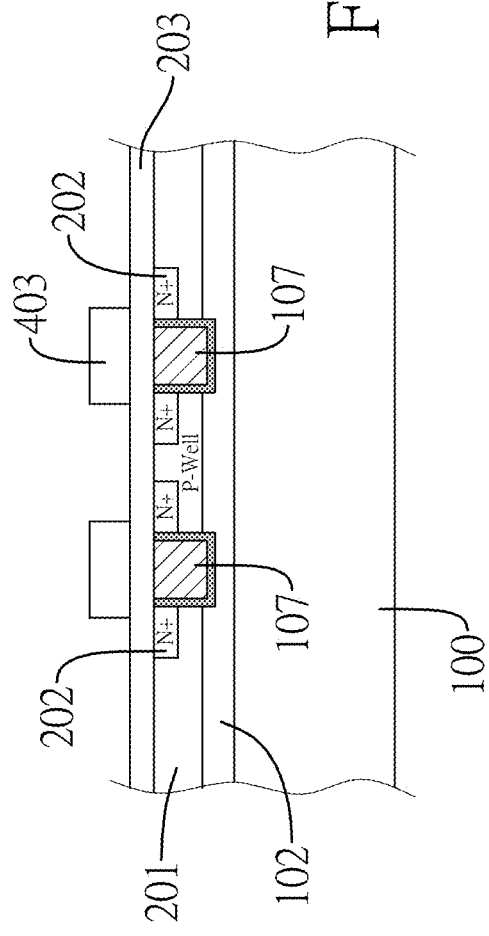

As shown in FIG. 4D, after the annealing is completed, the second mask layer 402 is removed, and an interlayer dielectric 203 is formed on the epitaxy layer 102. The interlayer dielectric 203 is an insulating material. A patterned third mask layer 403 is then disposed on the interlayer dielectric 203. The third mask layer 403 exposes the well 201 between two adjacent grooves 105 and part of the first implanted region 202 on both sides thereof.

Figure 4E:
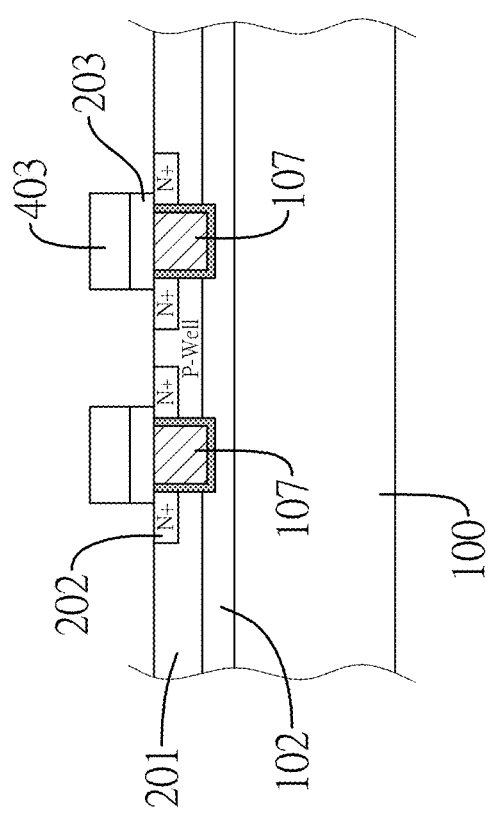

As shown in FIG. 4E, using the third mask layer 403 as an etching mask, the interlayer dielectric 203 is etched to remove the interlayer dielectric 203 exposed on the third mask layer 403.

Figure 4F:
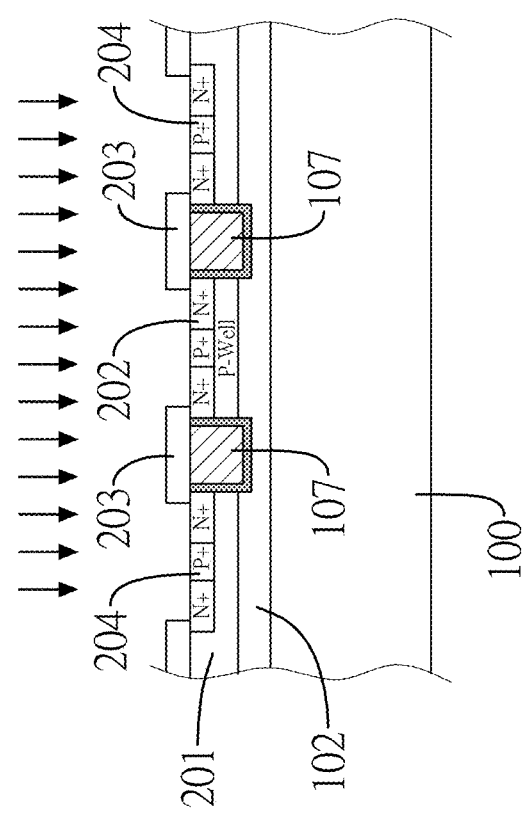

As shown in FIG. 4F, after the etching of the interlayer dielectric 203 is completed, the third mask layer 403 is removed, and heavy ion implantation or heavy doping is performed on the well 201 to form a second implanted region 204. The material used for ion implantation or doping is of a second conductivity type, e.g. P-type doping. Each second implanted region 204 is located between two adjacent first implanted regions 202. After the ion implantation is completed, an annealing step is performed to stabilize the implanted material in the second implanted region 204.

Figure 5A:
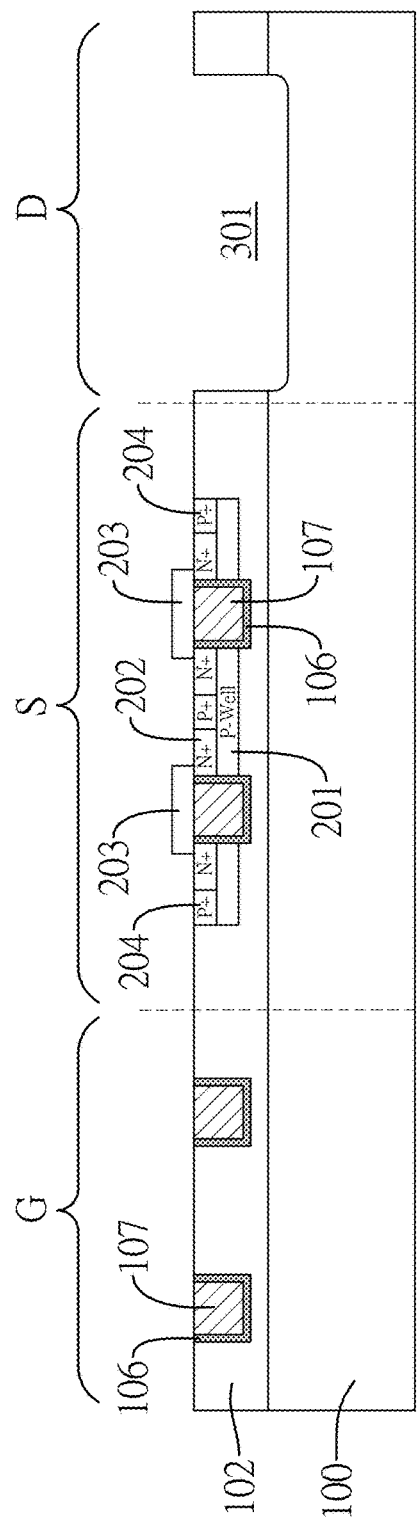

The production stage of the drain region:

As shown in FIG. 5A, a slot 301 is formed in the drain region D of the substrate 100. The depth of the slot 301 extends down to the substrate 100, so the epitaxy layer 102 at the position of the slot 301 is completely removed. The slot 301 can be formed by dry etching, wet etching, laser, tool cutting, etc. The method of forming the slot 301 is not particularly limited.

Figure 5B:
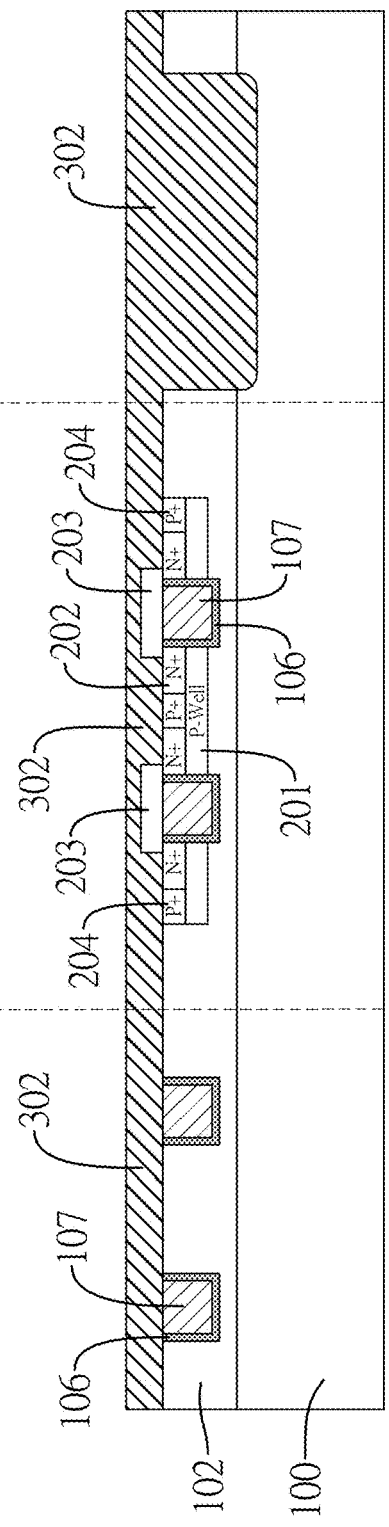

With reference to FIG. 5B, a first insulating layer 302 is formed on the substrate 100. The first insulating layer 302 fully covers the gate region G, the source region S and the drain region D, wherein, the thickness of the first insulating layer 302 is sufficient to fill the slot 301 and cover the inner dielectric layer 203 in the gate region G and the source region S. In one embodiment, the material of the first insulating layer 302 may be polyimide (PI).

Figure 6:
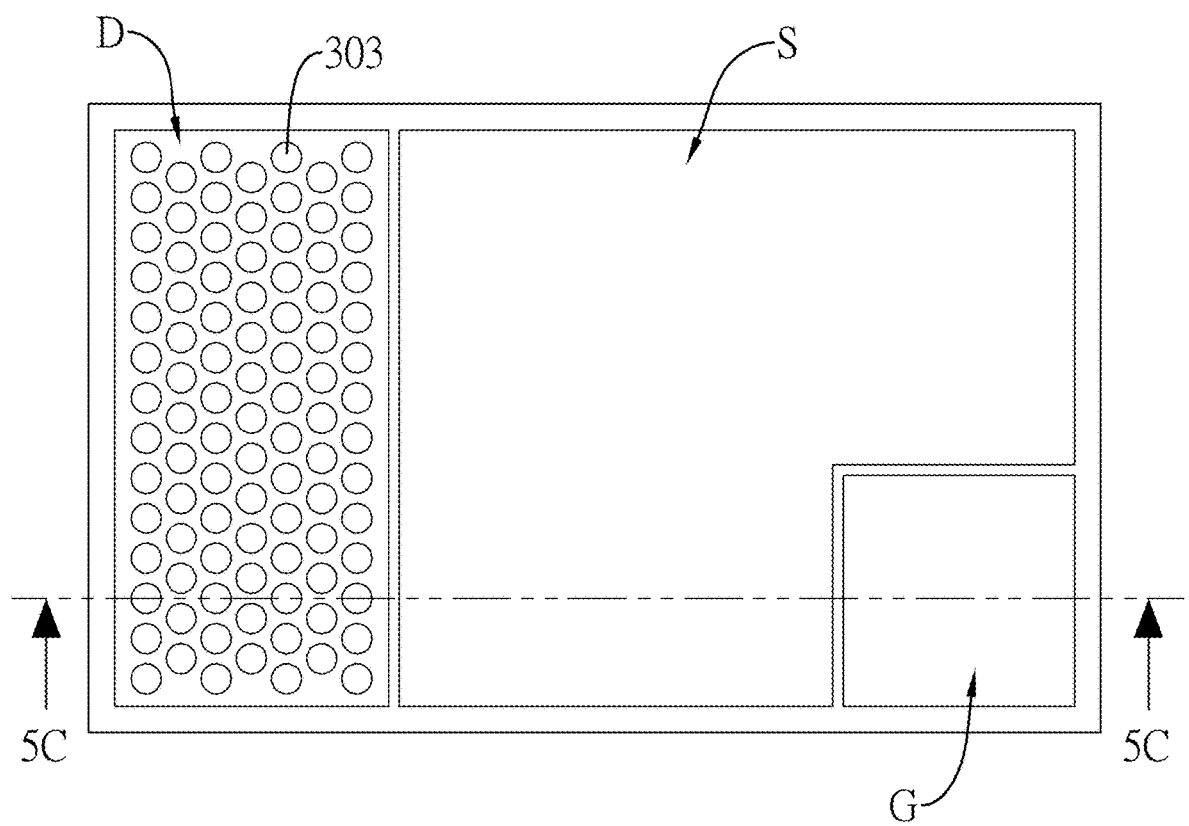
FIG. 6 is a schematic plan diagram of forming an via in the drain region of the present invention.

With reference to FIGS. 5C and 6, in the drain region D, a plurality of vias are formed in the first insulating layer 302. In this embodiment, the plurality of vias 303 are formed on the entire surface of the drain region D. The vias 303 penetrate through the first insulating layer 302 and extend to the substrate 100. The shape and arrangement of each via 303 are not limited; for example, each via 303 can be a square hole, a round hole, etc. The arrangement of the vias 303 can be a regular matrix or a staggered arrangement. FIG. 6 only schematically shows that the drain region D has a plurality of circular vias 303 arranged in a staggered manner.

In addition to forming vias 303 in the drain region D, in the gate region G and source region S, vias 303 penetrating the first insulating layer 302 are also formed at positions corresponding to each of the second implanted regions 204. The method of making the via 303 may include, but is not limited to, laser and etching.

With reference to FIG. 5D, a seed layer 304 is formed on the surface of the first insulating layer 302, the bottom of each via 303 and the sidewalls of each via 303, wherein the seed layer 304 is a conductive material (e.g., titanium/copper), which can be fabricated by sputtering.

With reference to FIG. 5E, a fourth mask layer 404 is formed on the seed layer 304. The pattern of the fourth mask layer 404 is consistent with the distribution of the gate region G, the source region S and the drain region D, and is used to separate the gate region G, the source region S and the drain region D. The fourth mask layer 404 can be a photoresist layer.

With reference to FIG. 5F, a connection layer 305 is covered on the seed layer 304 of the gate region G, the source region S and the drain region D. The material of the connection layer 305 has relatively low resistance compared to aluminum; for example, the connection layer 305 is a copper layer or a copper alloy layer. The connection layer 305 fills the vias 303 in each region and is electrically connected to the seed layer 304. The connection layers 305 in different regions are separated by the fourth mask layer 404.

With reference to FIGS. 5G-5H, after the connection layer 305 is fabricated, the fourth mask layer 404 is removed to expose the seed layer 304 originally covered by the fourth mask layer 404. The connection layers 305 between the gate region G, the source region S and the drain region D are separated from each other. After removing the fourth mask layer 404, the exposed seed layer 304 is further removed. For example, the seed layer 304 made of titanium/copper is removed by etching, so that the gate region G, the source region S and the drain region D are not directly electrically connected to each other through the seed layer 304

Figure 5I:
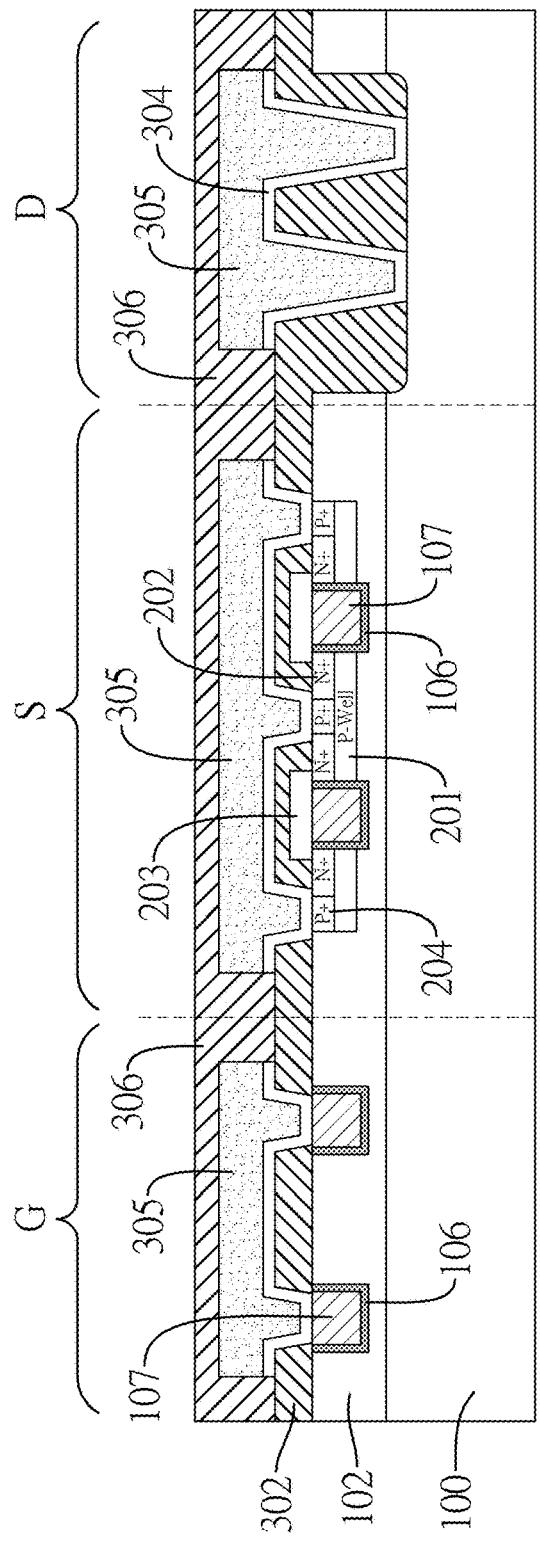
Figure 5J:
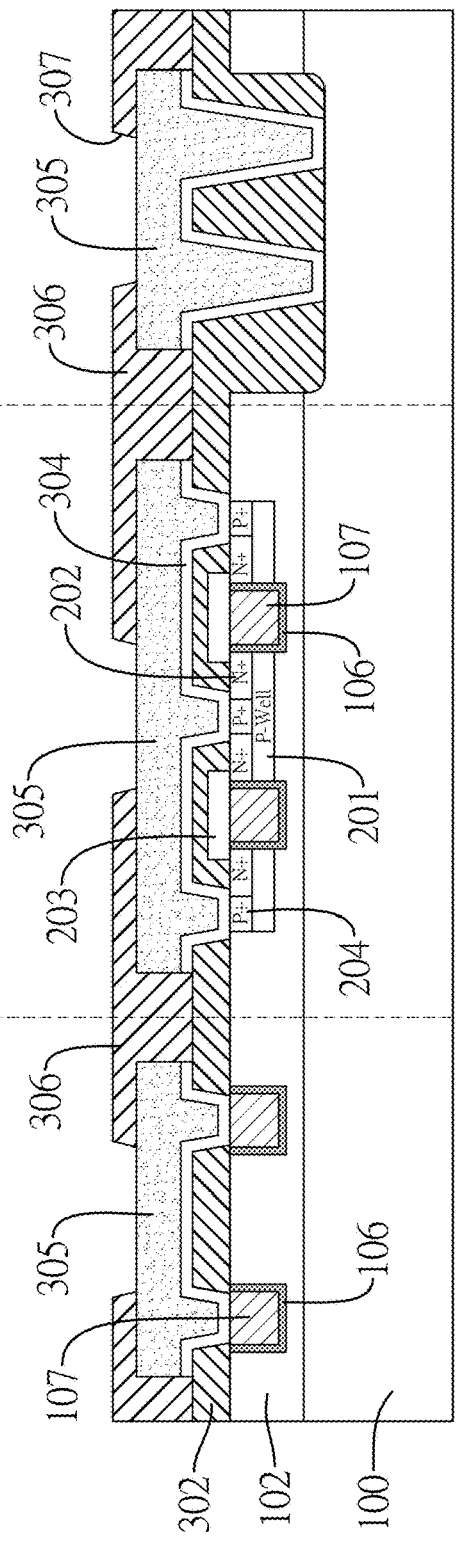

With reference to FIGS. 5I-5J, a second protective layer 306 is formed on the surface of the connection layer 305, and the second protective layer 306 completely covers the gate region G, the source region S and the drain region D. Several contact vias 307 are formed on the second protective layer 306. Each contact via 307 penetrates through the second protective layer 306 and extends to the connection layer 305. Wherein, the position and number of the contact vias 307 are determined by the position and the number of the bonding pads required by the MOS. In this embodiment, one contact via 307 is provided in the gate region G, three contact vias 307 are provided in the source region S, and two contact vias 307 are provided in the drain region D.

Figure 5K:
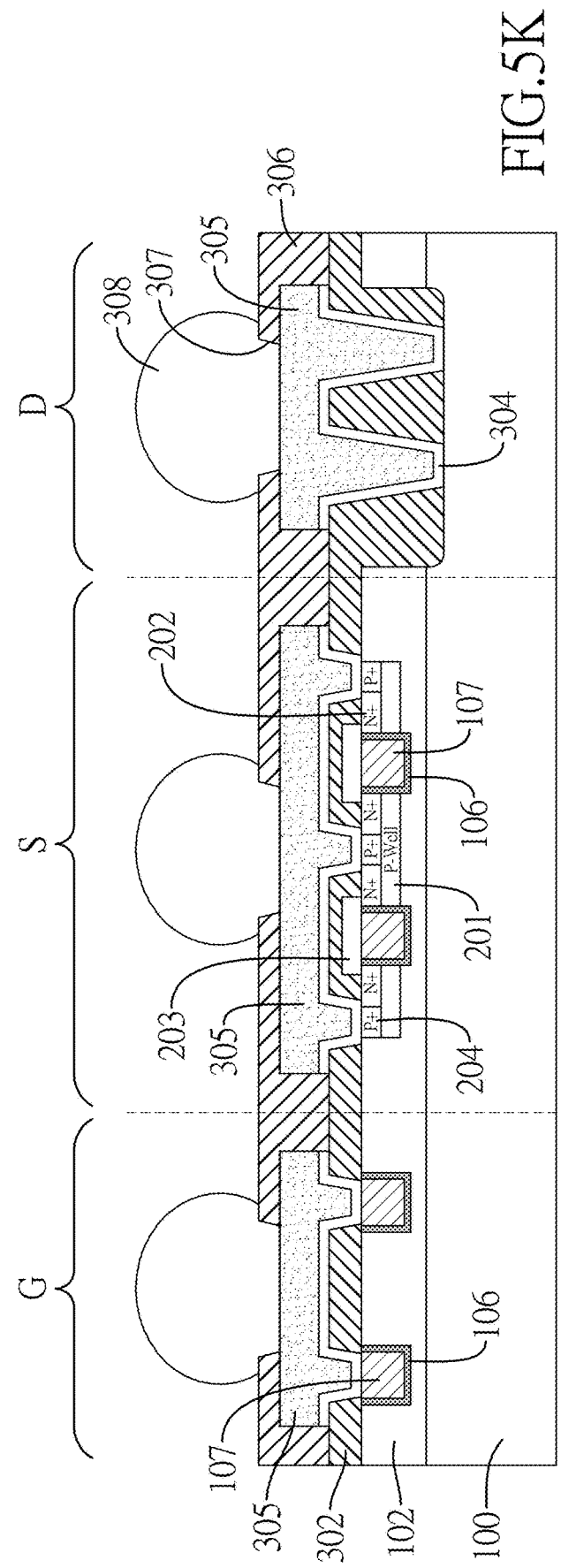
Figure 7:
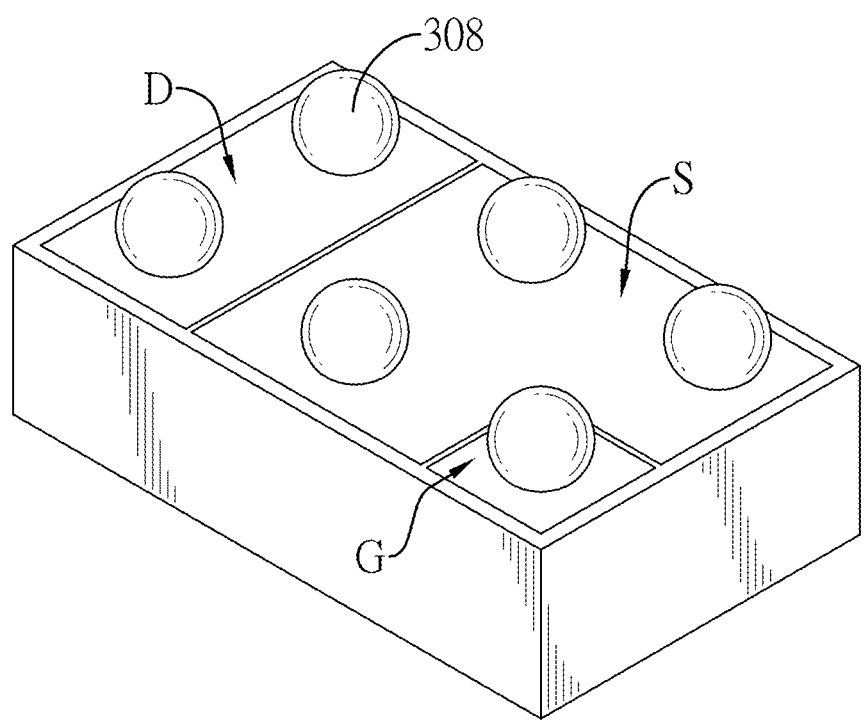
FIG. 7 is a three-dimensional schematic diagram of the MOS of the present invention.

With reference to FIGS. 5K and 7, each contact via 307 is provided with a conductive element 308, and the conductive element 308 is electrically connected to the connection layer 305. In this embodiment, each conductive element 308 is a solder ball, but in other embodiments, the conductive element 308 may also be a flat solder pad. In the gate region G, the conductive element 308 is electrically connected to the gate conductive layer 107 through the connection layer 305. In the source region S, the conductive element 308 is electrically connected to the second implanted region 204 of the source through the connection layer 305. In the drain region D, the conductive element 308 is electrically connected to the connection layer 305, and the connection layer 305 extends to the substrate 100.

In practical application, the present invention makes the gate region G, the source region S and the drain region D into a horizontal distribution. The MOS forms a contact that can be electrically connected to the outside elements on the same surface. Therefore, it can be fabricated by wafer-level chip scale packaging (WLCSP) technology, without the need for traditional lead frames, wire bonding, molding and other operations, using the conductive element 308 shown in FIG. 8 (such as solder balls) can be directly soldered on the printed circuit board. Compared with the traditional MOS, the volume of the MOS of the present invention can be further reduced.

In the present invention, a plurality of vias 303 (via) extending to the inside of the substrate 100 are formed in the drain region D, and filling the inside of the plurality of vias 303 with a conductive material to form a drain. The on-resistance $R_{DS(ON)}$ of the MOS chip between the source and the drain can be reduced.

Besides, in a preferred embodiment of the present invention, the top metal layer (i.e. the connection layer 305) of the MOS is made of low-resistance copper-containing metal instead of a traditional metal layer. The conductive elements 308 of the drain region D and of the source region S are connected to the internal circuit of the MOS through the connection layer 305 with low impedance characteristics. When the MOS is turned on by receiving the driving voltage, the on-resistance $R_{DS(ON)}$ between the drain region D and the source region S can be reduced. The signal transmission path between the MOS and the external printed circuit board is also relatively low impedance.

Figure 8:
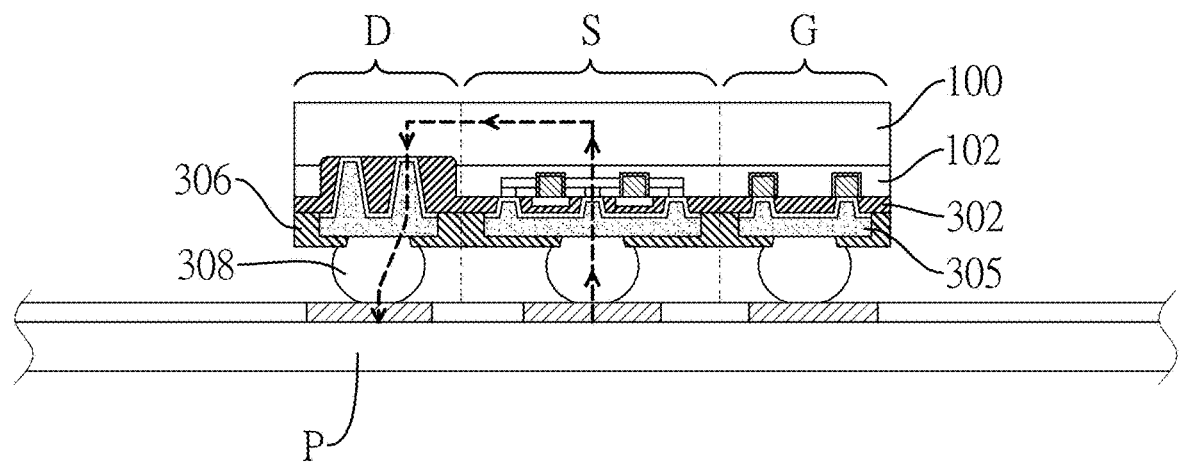
FIG. 8 is a schematic diagram of soldering the MOS to a circuit board in the present invention.

With reference to FIG. 8, it is shown that the drain (D), the source (S), and the gate (G) are fabricated on the same side, and there is no need to rely on the assembly to turn all electrodes to the same side, so the product size can be greatly reduced. Compared with FIG. 9, the dotted line in FIG. 8 indicates that the signal transmission path between the drain (D) and the source (S) can be further reduced, and the conductive media in the transmission path can also be simplified. In the present invention, the conductive element 308 on the chip can be directly connected to the contacts on the circuit board P, so that the overall on-resistance $R_{DS(ON)}$ can be reduced.

Figure 9:
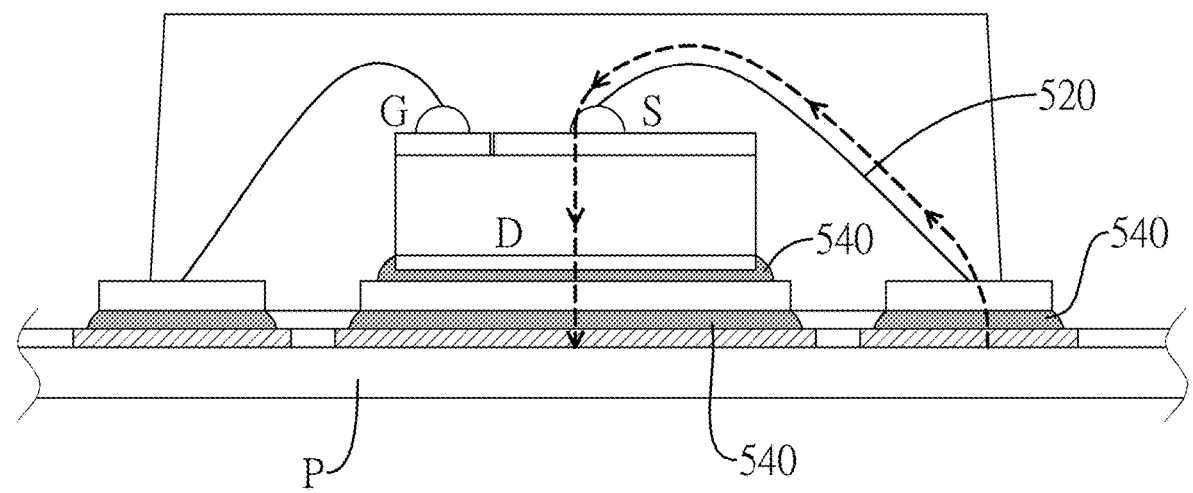
FIG. 9 is a schematic diagram of soldering a conventional MOS to a circuit board.
Figure 10:
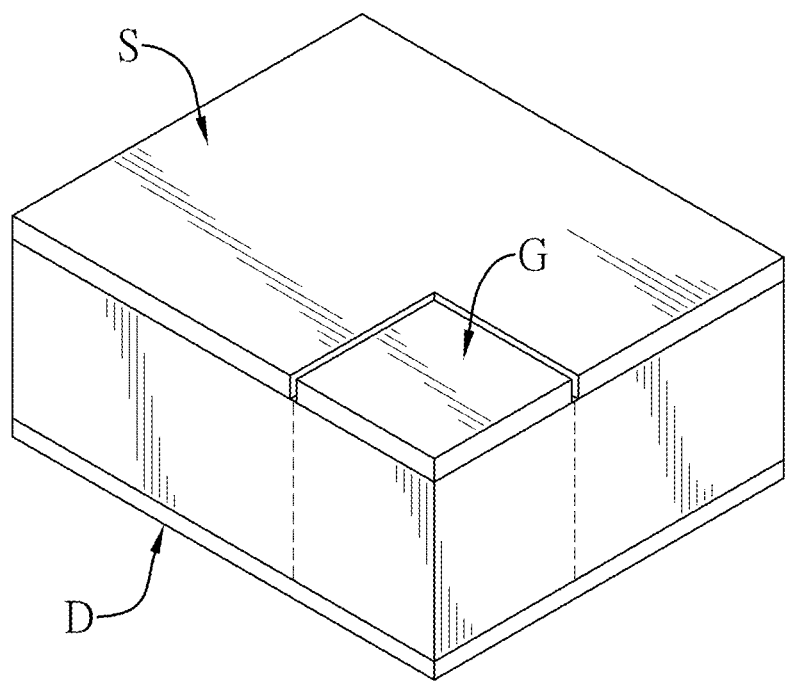
FIG. 10 is a schematic diagram of the contact positions of the gate, source and drain of the conventional MOS.
Figure 11:
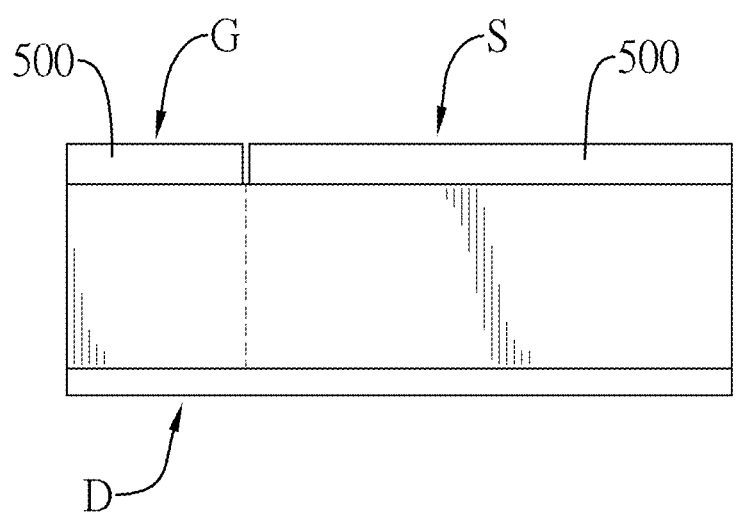
FIG. 11 is a cross-sectional diagram of the MOS in FIGS. 10.
Figure 12:
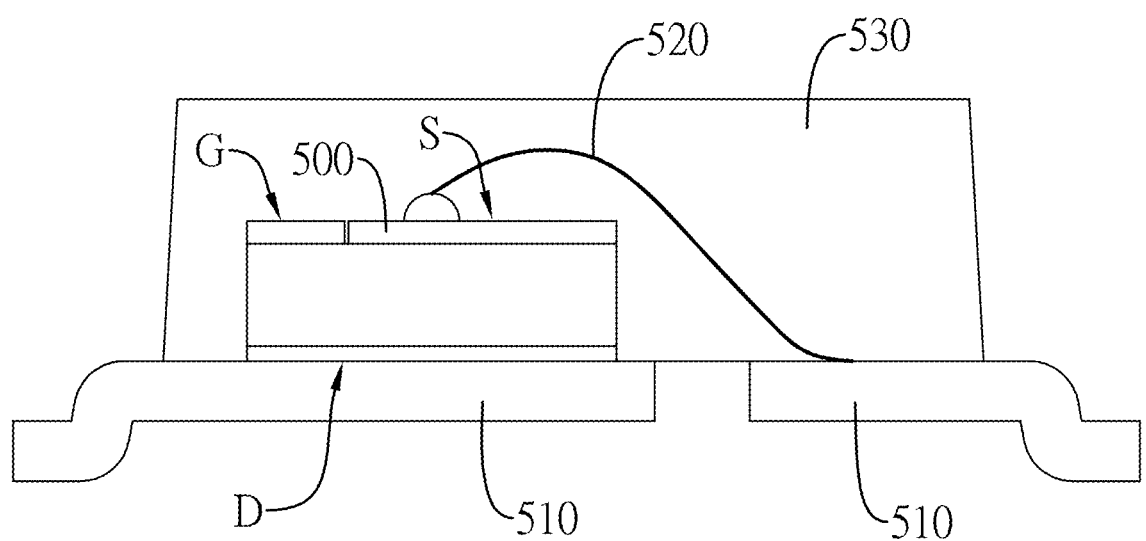
FIG. 12 is a schematic diagram of the MOS in FIG. 11 after packaging.

The size of the MOS packaged by the packing components of FIG. 9 will be larger than the entire chip, resulting in the lengthening of the conduction path (shown by the dotted line) between the chip and the circuit board P.

Moreover, the conductive media in the transmission path may pass through multiple layers (such as solder 540, metal wires 520, etc.), so the overall on-resistance $R_{DS(ON)}$ will be high.

Although the present invention has been illustrated and described herein with reference to preferred embodiments and specific examples thereof, it will be readily apparent to those of ordinary skill in the art. All such equivalent embodiments and examples are within the spirit and scope of the present invention, are contemplated thereby, and are intended to be covered by the following claims.

What is claimed is:

1. A metal oxide semiconductor (MOS) with multiple drain vias, comprising:
    a semiconductor substrate, having a gate region, a source region and a drain region, wherein, the gate region, the source region, and the drain region each has a respective connection layer made of a metal material and formed on a same surface of the semiconductor substrate;
    the semiconductor substrate having an epitaxy layer with a slot formed through the epitaxy layer, wherein a first protective layer fills the slot;
    a plurality of vias extending into the semiconductor substrate in the drain region, extending through the first protective layer and the epitaxy layer, and being filled with the connection layer;
    a second protective layer formed on the connection layers of the gate region, the source region and the drain region; and
    a plurality of contact vias formed through the second protective layer;
    wherein, the connection layers being coplanar to each other on the gate region, on the source region and on the drain region are insulated and separated from each other by the second protective layer, and are each electrically connected to a respective conductive element in the contact via; and
    the MOS is electrically connected to the outside through the conductive elements on the same surface.

2. The MOS with multiple drain vias as claimed in claim 1, wherein the connection layer is a copper layer or a copper alloy layer.

3. The MOS with multiple drain vias as claimed in claim 1, wherein the first protective layer extends to cover the epitaxy layer of the drain region and the source region.

4. The MOS with multiple drain vias as claimed in claim 1, wherein in the gate region, a plurality of gate conductive layers are formed in the epitaxy layer, and each of the gate conductive layers is electrically connected to the connection layer on the gate region.

5. The MOS with multiple drain vias as claimed in claim 4, wherein in the source region, a plurality of unit cells are formed in the epitaxy layer, and each unit cell includes a gate conductive layer and a first implanted region on both sides thereof; and
    a second implanted region is disposed between two adjacent said unit cells, and the connection layer in the source region electrically contacts the first implanted region and the second implanted region.

6. The MOS with multiple drain vias as claimed in claim 1, wherein each of the conductive elements is a solder ball or a flat pad.

* * * * *